US 6,796,458 B2

(12) United States Patent
Choi et al.

(10) Patent No.: US 6,796,458 B2
(45) Date of Patent: Sep. 28, 2004

(54) AIR SUPPLY APPARATUS FOR SEMICONDUCTOR DEVICE FABRICATING EQUIPMENT

(75) Inventors: Dug-Kyu Choi, Suwon-Si (KR); Yong-Won Seo, Suwon-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/618,600

(22) Filed: Jul. 15, 2003

(65) Prior Publication Data

US 2004/0065677 A1 Apr. 8, 2004

(30) Foreign Application Priority Data

Sep. 26, 2002 (KR) .................................. 10-2002-0058348

(51) Int. Cl.$^7$ ................................................ B01F 3/04
(52) U.S. Cl. ..................... 222/53; 222/65; 222/190; 222/399; 137/209; 261/130
(58) Field of Search ...................... 222/53, 64, 65, 222/190, 399; 137/209; 261/127–130

(56) References Cited

U.S. PATENT DOCUMENTS

| 6,190,063 B1 | * | 2/2001 | Akimoto | 396/611 |
| 6,338,474 B1 | * | 1/2002 | Semba | 261/128 |
| 2003/0066549 A1 | * | 4/2003 | Noda et al. | 134/37 |

* cited by examiner

Primary Examiner—Kenneth Bomberg
(74) Attorney, Agent, or Firm—Volentine Francos, PLLC

(57) ABSTRACT

An air supply apparatus includes a buffer tank for receiving and storing ultra-pure water from an ultra-pure source, a temperature/humidity controller (THC) for conditioning the air using the ultra-pure water from the buffer tank, an ultra-pure water pipe for delivering the ultra-pure water from the ultra-pure source to the buffer tank, and an air pipe for delivering the air from the THC to semiconductor device fabricating equipment. A control mechanism, including at least one valve disposed in the piping of the apparatus, allows the apparatus to be selectively operated in a normal mode in which the ultra-pure water is allowed to flow from the ultra-pure water source to the THC via the buffer tank, and a cleaning mode in which the THC runs using ultra-pure water stored in the buffer tank while the ultra-pure water pipe is being cleaned.

7 Claims, 2 Drawing Sheets

AIR SUPPLY APPARATUS FOR SEMICONDUCTOR DEVICE FABRICATING EQUIPMENT

BACKGROUND OF THE INVENTION

1. Field of the Invention

The present invention is directed to an air supply apparatus for regulating the temperature and humidity of air and for supplying the air to semiconductor device fabricating equipment.

2. Description of the Related Art

Generally, semiconductor devices are fabricated through many processes. In particular, a photolithographic process for forming required patterns is essential to the fabricating of semiconductor devices. A first step of the photolithographic process is to coat a wafer with a photoresist. This coating step is conducted by a coater unit. A very significant aspect of the coating step is the uniformity in thickness of the photoresist. The environment within the coater unit is critical to the degree to which the thickness of the coating of photoresist can be made uniform.

A typical coater unit has an air supply apparatus for automatically controlling the temperature and humidity within a coating chamber. Referring to FIG. 1, a conventional air supply apparatus 10 includes an electronic temperature/humidity controller (THC) 12, an ultra-pure water pipe 16 through which ultra-pure water from an ultra-pure water source 14 is delivered to the THC 12, and an air pipe 18 through which air is delivered to the semiconductor device fabricating equipment 20. The temperature/humidity controller (THC) regulates the temperature and humidity of the air to provide an optimum environment within a coating chamber of the semiconductor device fabricating equipment 20.

The inside of the ultra-pure water pipe 16a is periodically cleaned and sterilized to rid the ultra-pure water pipe 16 of microbes, such as bacteria. The cleaning of the ultra-pure water pipe 16 is conducted for a predetermined amount of time, e.g., 24 hours. The delivering of the ultra-pure water to the THC 12 is stopped during the cleaning of the ultra-pure water pipe 16, i.e., the air supply apparatus 10 is shut down.

SUMMARY OF THE INVENTION

An object of the present invention is to provide an air supply apparatus by which ultra-pure water can be supplied to a temperature/humidity controller even while an ultra-pure water pipe is being cleaned.

According to one aspect of the present invention, an air supply apparatus for use with semiconductor device fabricating equipment includes an ultra-pure water source, a buffer tank, an ultra-pure water pipe for delivering ultra-pure water to the buffer tank from the ultra-pure water source, a temperature/humidity controller that receives ultra-pure water from the buffer tank, an air pipe for providing temperature- and humidity-conditioned air from the temperature/humidity controller to the semiconductor device fabricating equipment, and control means for allowing the apparatus to be operated in both a normal mode and a cleaning mode in which the temperature/humidity controller receives ultra-pure water.

The control means preferably comprises at least one valve disposed in the piping of the air supply apparatus, such as in the ultra-pure water pipe, and a change switch for controlling the opening/closing of the valve(s).

The air supply apparatus may further include a nitrogen supply pipe connecting a source of nitrogen to the buffer tank so as to provide pressure that forces the ultra-pure water from the buffer tank to the temperature/humidity controller during the cleaning mode. An exhaust pipe is connected to the buffer tank for allowing the nitrogen gas to be exhausted from the buffer tank once the normal mode resumes. In this case, the control means also includes valves disposed in the exhaust pipe and the nitrogen supply pipe, respectively.

Sensors may also be provided for sensing the level of the ultra-pure water in the buffer tank.

DETAILED DESCRIPTION OF THE PREFERRED EMBODIMENTS

Figure 1:
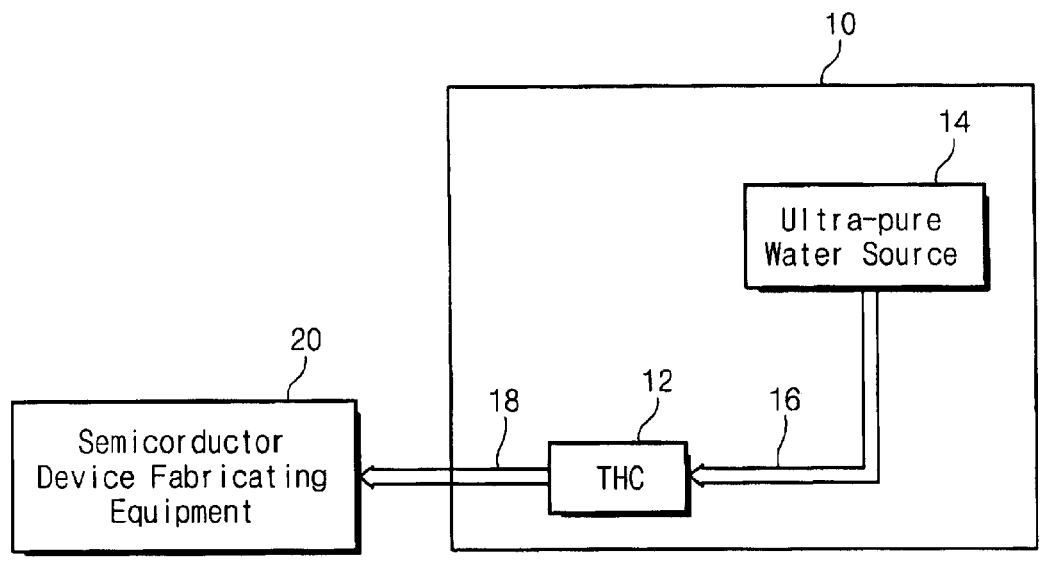
FIG. 1 is a schematic diagram of a conventional air supply apparatus for use with semiconductor device fabricating equipment.
Figure 2:
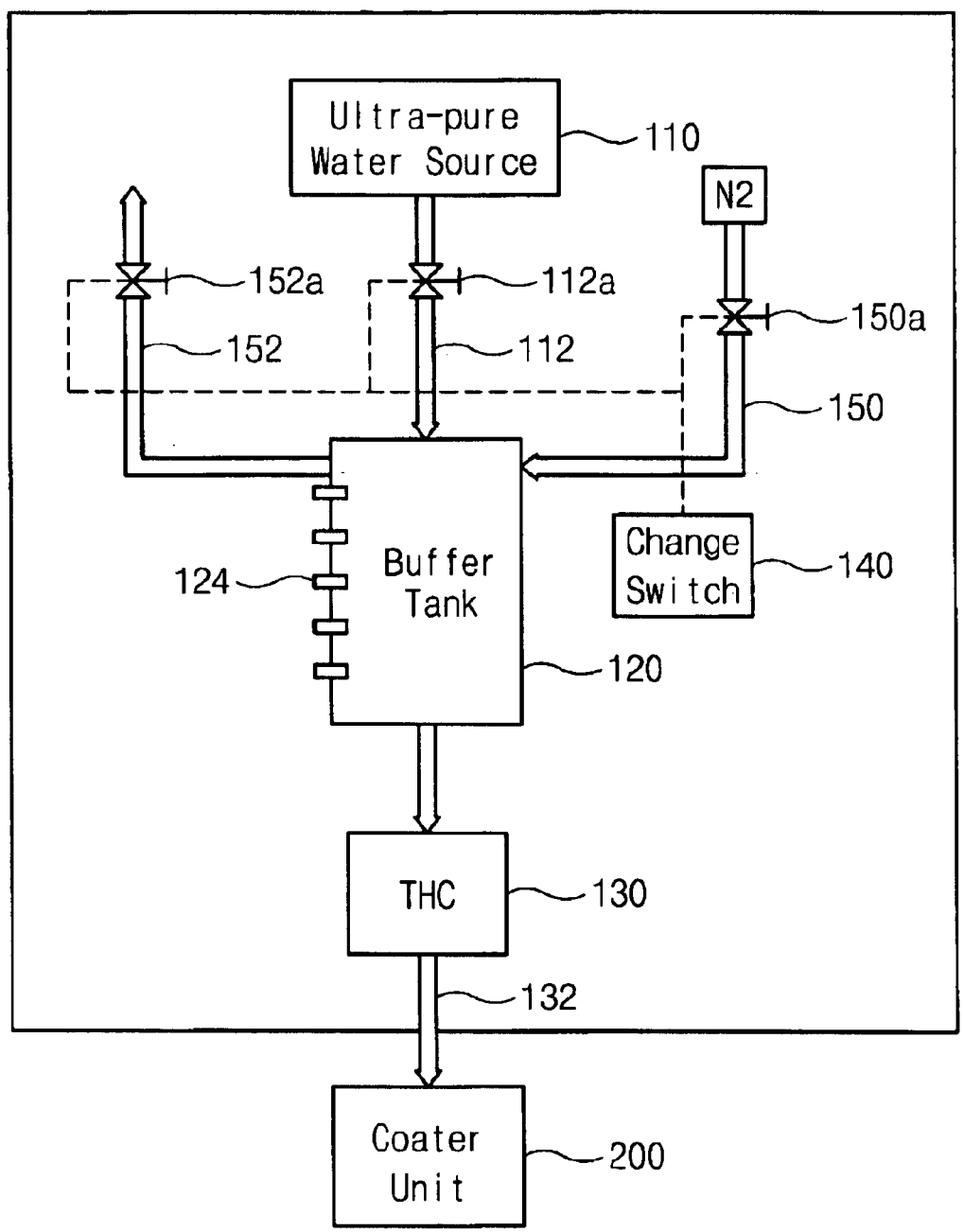
FIG. 2 is a schematic diagram of air supply apparatus for automatically controlling the temperature and humidity of air within a coater unit according to the present invention.

An air supply apparatus for automatically controlling the temperature and humidity of the environment within a coater unit will now be described with reference to FIG. 2.

The air supply apparatus 100 according to the present invention includes an ultra-pure water source 110, a buffer tank 120, a temperature/humidity controller (THC) 130, a change switch 140, pipes connected to the buffer tank 120 and the THC 130, and valves disposed in respective ones of the pipes. The pipes include an ultra-pure water pipe 112, an air pipe 132, a nitrogen supply pipe 150, and an exhaust pipe 152. The valves include a valve 112a disposed in the ultra-pure water pipe 112, a valve 150a disposed in the nitrogen supply pipe 150, and a valve 152a disposed in the exhaust pipe 152. The valves can be moved between open and closed positions to allow and interrupt the flow of fluid through their respective pipes.

The ultra-pure water pipe 112 serves to provide ultra-pure water from the ultra-pure water source 110 to the buffer tank 120. The air pipe 132 serves to provide air from the THC 130 to a coater unit 200. The nitrogen supply pipe 150 serves to deliver nitrogen to the buffer tank 120 and thereby force the ultra-pure water from the buffer tank 120 into the THC 130 during a cleaning mode (i.e., during the cleaning of an ultra-pure water pipe). The exhaust pipe 152 serves to allow nitrogen gas to be exhausted from the buffer tank 120.

A plurality of level sensors 124 for sensing a water level are installed in the buffer tank 120. Preferably, the buffer tank 120 has a capacity that is greater than the amount of ultra-pure water used in a day of operating the coater unit 200.

The change switch 140 controls valves 112a, 152a, and 150a such that the air supply apparatus 100 can operate in either a normal mode or the aforementioned cleaning mode. The change switch 140 may comprise any known mechanisms for moving the valves 112a, 152a, and 150a between their open and closed positions, respectively, as well as input and control devices by which the valve operating mechanisms are actuated.

More specifically, in the normal mode, ultra-pure water is provided from the ultra-pure water source 110 to the THC 130 through the ultra-pure water pipe 112 and the buffer tank 120. The THC 130 regulates the air to be provided to the coater unit 200 through the air pipe 132 to a predetermined temperature (e.g., 23° C.) and a predetermined humidity (e.g., 45%). In this normal mode, the first and second valves 112a and 152a are opened and the third valve 150a is closed.

The ultra-pure water pipe 112 and the other ultra-pure water pipes in the semiconductor device fabricating equipment are periodically cleaned and sterilized to rid the pipes of microbes, such as bacteria. At this time, the mode of operation of the air supply apparatus 100 is changed from the normal mode to the cleaning mode. That is, the input device of the change switch 140 is pressed whereupon the first and third valves 112a and 152a are closed and the second valve 150 is opened. In the cleaning mode, ultra-pure water is provided to the THC 130 by the pressure of nitrogen supplied from the nitrogen supply pipe 150 to the buffer tank 120. Therefore, the semiconductor device fabricating equipment, i.e., the coater unit 200, does not need to be shut down during the cleaning mode. The ultra-pure water required by the THC 130 during the cleaning mode is stored in the buffer tank 120. When the water level in the buffer tank 120 recedes below a reference value, the level sensors 124 provide an interlock signal to a main controller (not shown) of the semiconductor device fabricating equipment.

Once the cleaning of the ultra-pure water pipes is completed, the input device of the change switch 140 is pressed to change the operating mode of the air supply apparatus 100 from the cleaning mode to the normal mode. As a result, the buffer tank 120 is filled with ultra-pure water from the ultra-pure water source 100.

As is clear from the description above, during the normal mode, the ultra-pure water is provided from the buffer tank 120 to the THC 130 by pressure from the ultra-pure water source 110. In the cleaning mode, the ultra-pure water is provided from the buffer tank 120 to the THC by the pressure of nitrogen supplied from the nitrogen supply pipe 150. The buffer tank is thus used to prevent downtime during the semiconductor device fabricating process.

Finally, although the present invention has been described herein with respect to the preferred embodiment thereof as shown in the accompanying drawing, the detailed description and the drawing figure are meant to be illustrative of the principles behind the invention and not limiting. That is, various other embodiments are seen to be within the true spirit and scope of the invention as defined by the appended claims.

What is claimed is:

1. An air supply apparatus in combination with semiconductor device fabricating equipment, the air supply apparatus comprising:

a source of ultra-pure water;

a buffer tank;

an ultra-pure water pipe connecting said source of ultra-pure water to said buffer tank so as to deliver ultra-pure water from the source of ultra-pure water to the buffer tank;

a temperature/humidity controller connected to said buffer tank so as to receive ultra-pure water therefrom and operative to control the temperature and humidity of air;

an air pipe connecting said temperature/humidity controller to the semiconductor device fabricating equipment so as to deliver the air from the temperature/humidity controller to the semiconductor device fabricating equipment; and at least one valve that allows the air supply apparatus to be selectively operated in a normal mode in which ultra-pure water is delivered from said source of ultra-pure water through said ultra-pure water pipe to said buffer tank and from said buffer tank to said temperature/humidity controller, and a cleaning mode in which the ultra-pure water in the buffer tank is delivered to the temperature/humidity controller while the delivery of ultra-pure water from said source of ultra-pure water to said buffer tank through said ultra-pure water pipe is stopped.

2. The combination as set forth in claim 1, wherein said air supply apparatus further comprises a source of nitrogen, and a nitrogen supply pipe connecting said source of nitrogen to said buffer tank, whereby nitrogen delivered to said buffer tank through the nitrogen supply pipe forces ultra-pure water from the buffer tank into the temperature/humidity controller.

3. The combination as set forth in claim 2, wherein said air supply apparatus further comprises an exhaust pipe connected to said buffer tank and through which nitrogen gas can be exhausted from the buffer tank.

4. The combination as set forth in claim 1, wherein said air supply apparatus further comprises level sensors operative to sense the level of the ultra-pure water in the buffer tank.

5. The combination as set forth in claim 1, wherein said at least one valve comprises a valve disposed in said ultra-pure water pipe.

6. The combination as set forth in claim 3, wherein said at least one valve comprises respective valves disposed in said exhaust pipe, said nitrogen supply pipe, and said ultra-pure water pipe.

7. An air supply apparatus in combination with semiconductor device fabricating equipment, the air supply apparatus comprising:

a source of ultra-pure water;

a buffer tank;

an ultra-pure water pipe connecting said source of ultra-pure water to said buffer tank so as to deliver ultra-pure water from the source of ultra-pure water to the buffer tank;

a temperature/humidity controller connected to said buffer tank so as to receive ultra-pure water therefrom and operative to control the temperature and humidity of air;

an air pipe connecting said temperature/humidity controller to the semiconductor device fabricating equipment so as to deliver the air from the temperature/humidity controller to the semiconductor device fabricating equipment; and control means for allowing the apparatus to be selectively operated in a normal mode and a cleaning mode, the temperature/humidity controller receiving ultra-pure water during each of said modes.

* * * * *